United States Patent
Roohparvar

(10) Patent No.: US 7,154,785 B2
(45) Date of Patent: Dec. 26, 2006

(54) CHARGE PUMP CIRCUITRY HAVING ADJUSTABLE CURRENT OUTPUTS

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 9 days.

(21) Appl. No.: 10/877,394

(22) Filed: Jun. 25, 2004

(65) Prior Publication Data

US 2005/0286310 A1 Dec. 29, 2005

(51) Int. Cl.
G11C 16/04 (2006.01)
(52) U.S. Cl. .................... 365/185.18; 365/185.22; 365/189.09; 365/189.11
(58) Field of Classification Search .......... 365/189.18, 365/189.09, 189.11, 189.01, 185.18, 185.22
See application file for complete search history.

(56) References Cited

U.S. PATENT DOCUMENTS

| | | | | |
|---|---|---|---|---|
| 5,339,279 A | * | 8/1994 | Toms et al. ............ | 365/185.11 |
| 5,784,315 A | * | 7/1998 | Itoh ...................... | 365/185.22 |
| 5,818,764 A | * | 10/1998 | Yiu et al. .............. | 365/185.11 |
| 5,909,141 A | * | 6/1999 | Tomishima ................. | 327/536 |
| 6,009,022 A | | 12/1999 | Lee | |
| 6,038,178 A | * | 3/2000 | Oh ........................ | 365/189.09 |
| 6,128,242 A | * | 10/2000 | Banba et al. ............... | 365/226 |
| 6,208,198 B1 | * | 3/2001 | Lee ............................ | 327/536 |
| 6,314,025 B1 | * | 11/2001 | Wong .................... | 365/185.22 |
| 6,392,936 B1 | * | 5/2002 | Mulatti et al. ......... | 365/189.09 |
| 6,577,535 B1 | * | 6/2003 | Pasternak .............. | 365/185.11 |
| 6,714,457 B1 | | 3/2004 | Hsu | |
| 6,809,573 B1 | * | 10/2004 | Kim ........................... | 327/536 |
| 2003/0172309 A1 | * | 9/2003 | Cioaca ....................... | 713/300 |

* cited by examiner

Primary Examiner—Huan Hoang
(74) Attorney, Agent, or Firm—Leffert, Jay & Polglaze P.A.

(57) ABSTRACT

Methods and apparatus are provided. A memory device includes charge pump circuitry having a plurality of parallel charge pumps for supplying a programming voltage to an array of memory cells of the memory device. Each of the charge pumps is adapted to output a fraction of a total current output capacity of the charge pump circuitry, and each is adapted to be selectively enabled for adjusting current output from the charge pump circuitry to the memory array according to a number of the memory cells to be programmed.

66 Claims, 4 Drawing Sheets

CHARGE PUMP CIRCUITRY HAVING ADJUSTABLE CURRENT OUTPUTS

TECHNICAL FIELD OF THE INVENTION

The present invention relates generally to memory devices and in particular the present invention relates to charge pump circuitry for memory devices having adjustable current outputs.

BACKGROUND OF THE INVENTION

Memory devices are typically provided as internal storage areas in computers. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed on an individual basis by charging the floating gate. The charge can be removed from the floating gate by a block erase operation. The data in a cell is determined by the presence or absence of the charge on the floating gate.

NOR and NAND flash memory devices are two common types of flash memory devices, so called for the logical form the basic memory cell configuration in which each is arranged. Typically, for NOR flash memory devices, the control gate of each memory cell of a row of the array is connected to a word line, and the drain region of each memory cell of a column of the array is connected to a bit line. The memory array for NOR flash memory devices is accessed by a row decoder activating a row of floating gate memory cells by selecting the word line connected to their control gates. The row of selected memory cells then place their data values on the column bit lines by flowing a differing current, depending upon their programmed states, from a connected source line to the connected column bit lines.

The array of memory cells for NAND flash memory devices is also arranged such that the control gate of each memory cell of a row of the array is connected to a word line. However, each memory cell is not directly connected to a column bit line by its drain region. Instead, the memory cells of the array are arranged together in strings (often termed NAND strings), e.g., of 32 each, with the memory cells connected together in series, source to drain, between a source line and a column bit line. The memory array for NAND flash memory devices is then accessed by a row decoder activating a row of memory cells by selecting the word line connected to a control gate of a memory cell. In addition, the word lines connected to the control gates of unselected memory cells of each string are driven to operate the unselected memory cells of each string as pass transistors, so that they pass current in a manner that is unrestricted by their stored data values. Current then flows from the source line to the column bit line through each series connected string, restricted only by the selected memory cells of each string. This places the current-encoded data values of the row of selected memory cells on the column bit lines.

Typical flash memory uses a single bit-per-cell. Each cell is characterized by a specific threshold voltage or Vt level. Within each cell, two possible Vt levels exist. These Vt levels are controlled by the amount of charge that is programmed or stored on the floating gate. If a cell Vt is above a read voltage applied to its control gate, it has a first data value; if below, a second data value.

Multilevel cells have been introduced to greatly increase the density of a flash memory device. This technology enables storage of multiple bits per memory cell by charging the floating gate of the transistor to different levels. This technology takes advantage of the analog nature of a traditional flash cell by assigning a bit pattern to a specific voltage range stored on the cell. This technology permits the storage of two or more bits per cell, depending on the quantity of voltage ranges assigned to the cell. For example, a cell may be assigned four different voltage ranges of 200 mV for each range. Typically, a dead space or guard band of 0.2V to 0.4V is between each range. If the Vt of the cell is within the first range, the cell is storing a 00. If the Vt is within the second range, the cell is storing a 01. This continues for as many ranges as are used for the cell.

Flash memory devices typically require precise voltages for operation, especially multilevel cells, which usually require more precise voltages than normal two state cells. Ripple on the output of charge pumps can make it difficult to establish such precise voltages.

For the reasons stated above, and for other reasons stated below which will become apparent to those skilled in the art upon reading and understanding the present specification, there is a need in the art for alternatives for programming memory arrays.

SUMMARY

The above-mentioned problems with programming memory arrays and other problems are addressed by the present invention and will be understood by reading and studying the following specification.

For one embodiment, the invention provides a method of programming a memory array that includes selectively enabling one or more of a plurality of charge pumps based on a number of memory cells to be programmed.

For another embodiment, the invention provides a method of programming a memory array that includes determining a number of a plurality of charge pumps to be enabled based on a number of memory cells to be programmed, and selectively enabling the number of charge pumps.

For another embodiment, the invention provides a method of operating a memory device that includes supplying a first current to memory cells of a memory array of the memory device for programming the memory cells, and determining whether any of the memory cells are inadequately programmed. If there are any inadequately programmed memory cells, the method includes determining a second current sufficient for programming the inadequately programmed memory cells, where the second current is a fraction of the first current, and supplying at least the second current to the inadequately programmed memory cells for programming the inadequately programmed memory cells.

For another embodiment, the invention provides a flash memory device having a memory array comprising flash memory cells arranged in rows and columns, control circuitry for controlling access to the array of flash memory cells, and charge pump circuitry having a plurality of parallel charge pumps for supplying a programming voltage to the array. Each of the charge pumps is adapted to output a fraction of a total current capacity of the charge pump circuitry, and each of the charge pumps is adapted to be selectively enabled by the control circuitry for adjusting current output from the charge pump circuitry to the memory array according to a number of the memory cells to be programmed.

Further embodiments of the invention include methods and apparatus of varying scope.

DETAILED DESCRIPTION

Figure 1:
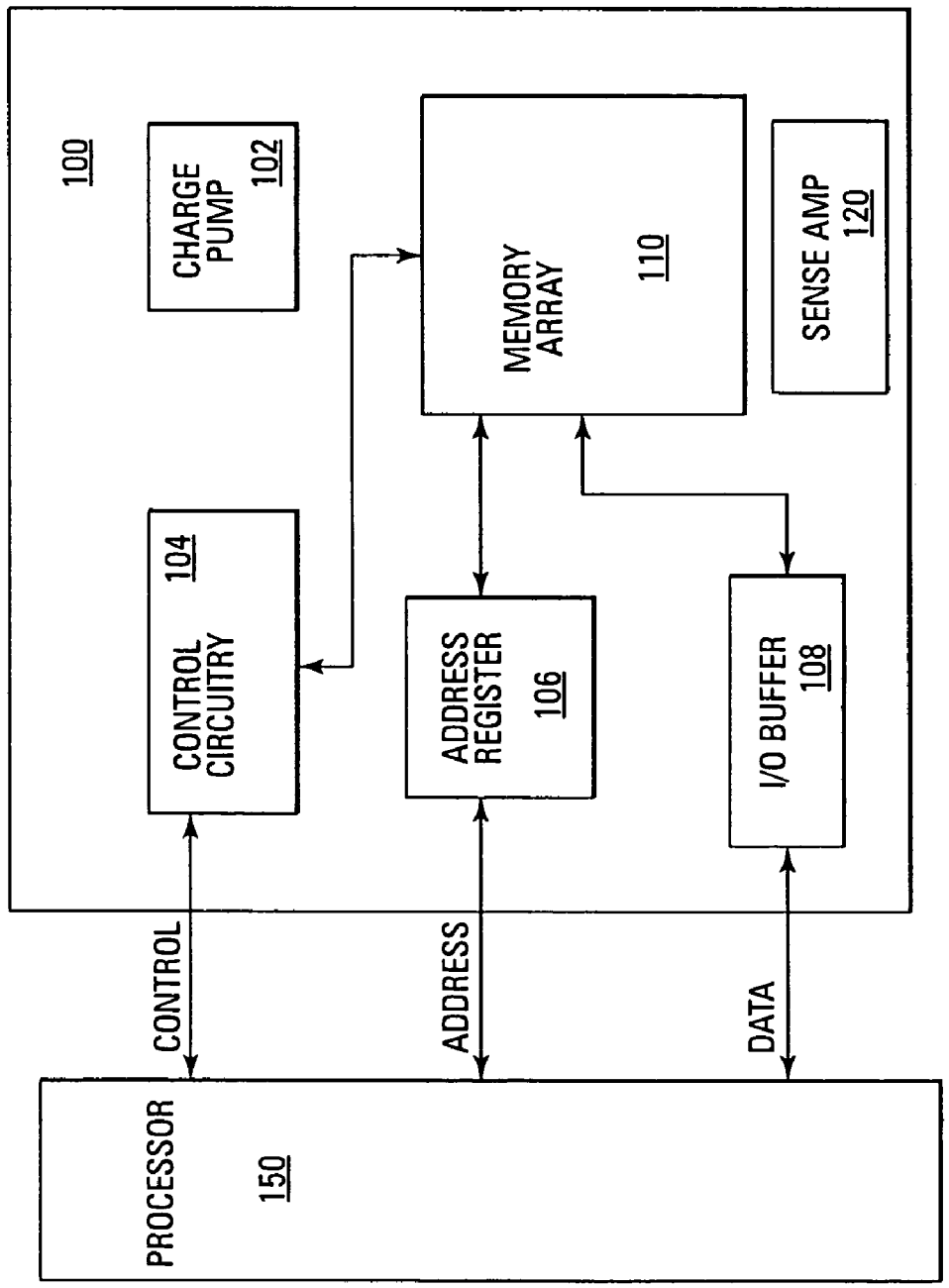
FIG. 1 is a simplified block diagram of an integrated flash memory device, according to an embodiment of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 is a simplified block diagram of an integrated flash memory device 100, such as NAND or NOR flash, according to an embodiment of the present invention. Flash memory device 100 includes a charge pump circuitry 102 to provide voltages of a predetermined level, such as a programming voltage (Vpp), to memory cells within the memory array 110 during memory operations. Control circuitry 104 is provided to control access to the memory array 110. An address register 106 is used to receive address requests to memory array 110. In addition, an input/output (I/O) buffer 108 is used to smooth out the flow of data to and from the memory array 110. Sense amplifier and compare circuitry 120 is used to sense data stored in the memory cells and verify the accuracy of stored data. For one embodiment, sense amplifier and compare circuitry 120 compares the current of the memory cell of memory array 110 to a reference current as a part of a program-verify operation.

FIG. 1 also illustrates an exterior processor 150, or memory controller, electrically coupled to memory device 100 for memory accessing as part of an electronic system. Processor 150 is coupled to the control circuitry 104 to supply control commands. Processor 150 is also coupled to the address register to supply address requests. Moreover, processor 150 is coupled to the 110 buffer 108 to send and receive data.

Figure 2:
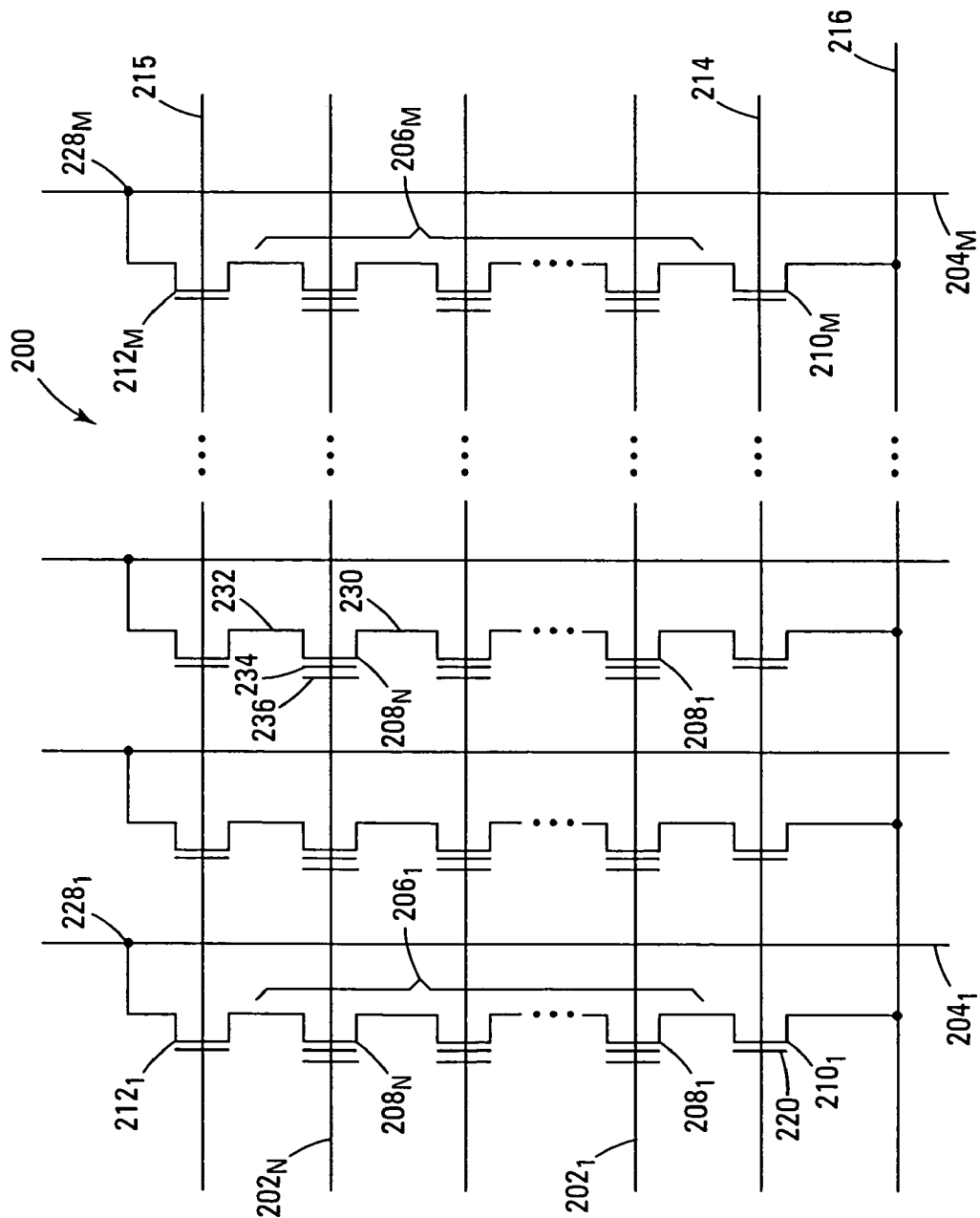
FIG. 2 is a schematic of a NAND memory array, according to another embodiment of the present invention.

FIG. 2 is a schematic of a NAND memory array 200 as a portion of memory array 110 in accordance with another embodiment of the invention. As shown in FIG. 2, the memory array 200 includes word lines $202_1$ to $202_N$ and intersecting local bit lines $204_1$ to $204_M$. For ease of addressing in the digital environment, the number of word lines 202 and the number of bit lines 204 are each some power of two, e.g., 256 word lines 202 by 4,096 bit lines 204. The local bit lines 204 are coupled to global bit lines (not shown) in a many-to-one relationship.

Memory array 200 includes NAND strings $206_1$ to $206_M$. Each NAND string includes floating-gate transistors $208_1$ to $208_N$, each located at an intersection of a word line 202 and a local bit line 204. The floating-gate transistors 208 represent non-volatile memory cells for storage of data. The floating-gate transistors 208 of each NAND string 206 are connected in series source to drain between a source select gate 210, e.g., a field-effect transistor (FET), and a drain select gate 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate 220 of each source select gate 210 is connected to source select line 214.

The drain of each drain select gate 212 is connected to a local bit line 204 for the corresponding NAND string at a drain contact 228. For example, the drain of drain select gate $212_1$ is connected to the local bit line $204_1$ for the corresponding NAND string $206_1$ at drain contact $228_1$. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding-NAND string $206_1$.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 are those NAND strings 206 coupled to a given local bit line 204. A row of the floating-gate transistors 208 are those transistors commonly coupled to a given word line 202.

Figure 3:
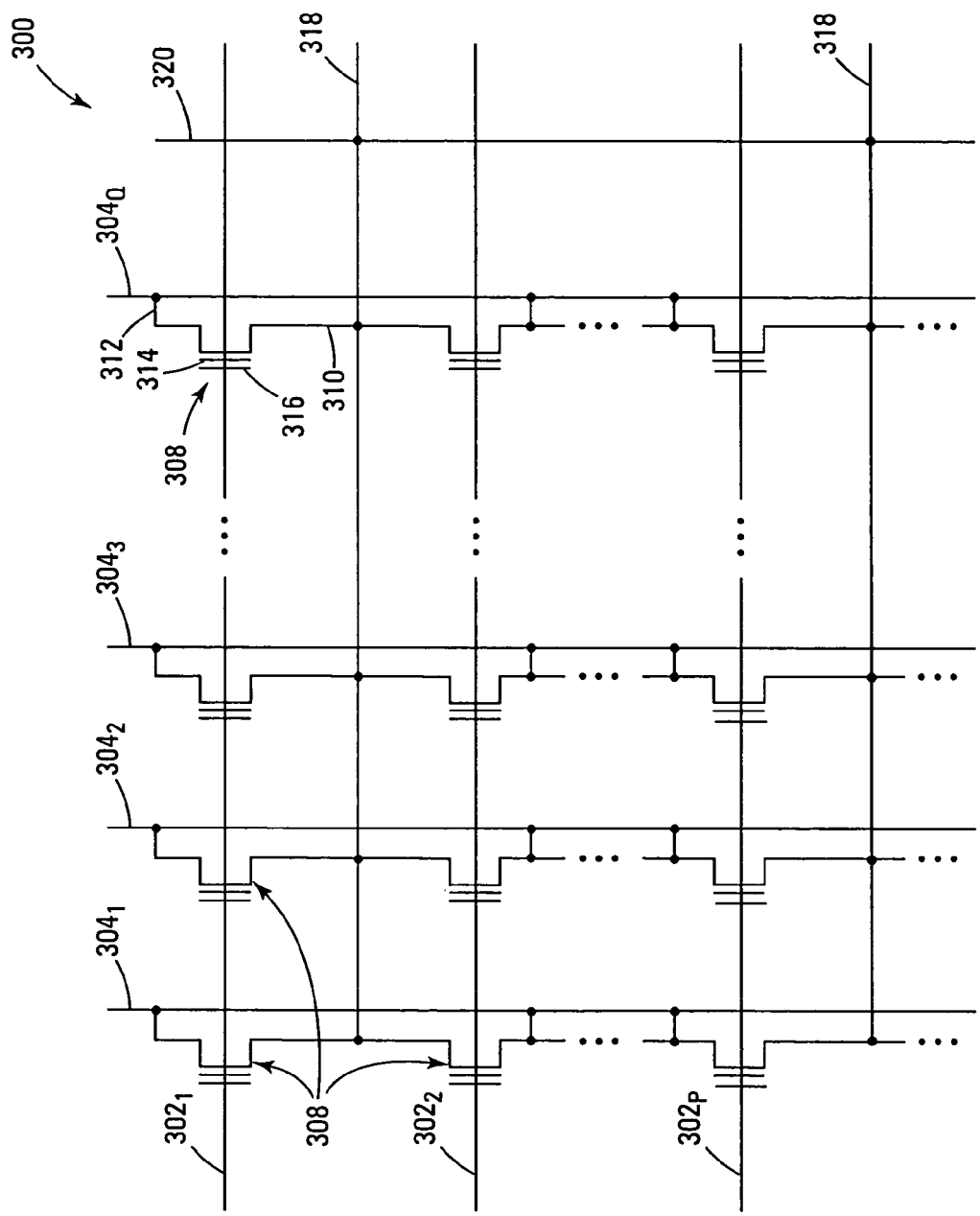
FIG. 3 is a schematic of a NOR memory array, according to another embodiment of the present invention.

FIG. 3 is a schematic of a NOR memory array 300 as a portion of memory array 110 of FIG. 1 in accordance with another embodiment of the invention. Memory array 300 includes word lines $302_1$ to $302_P$ and intersecting local bit lines $304_1$ to $304_Q$. For ease of addressing in the digital environment, the number of word lines 302 and the number of bit lines 304 are each some power of two, e.g., 256 word lines 302 by 4,096 bit lines 304. The local bit lines 304 are coupled to global bit lines (not shown) in a many-to-one relationship.

Floating-gate transistors 308 are located at each intersection of a word line 302 and a local bit line 304. The floating-gate transistors 308 represent non-volatile memory cells for storage of data. Typical construction of such floating-gate transistors 308 includes a source 310 and a drain 312, a floating gate 314, and a control gate 316.

Floating-gate transistors 308 having their control gates 316 coupled to a word line 302 typically share a common source depicted as array source 318. As shown in FIG. 3, floating-gate transistors 308 coupled to two adjacent word lines 302 may share the same array source 318. Floating-gate transistors 308 have their drains 312 coupled to a local bit line 304. A column of the floating-gate transistors 308 includes those transistors commonly coupled to a given local bit line 304. A row of the floating-gate transistors 308 includes those transistors commonly coupled to a given word line 302.

To reduce problems associated with high resistance levels in the array source 318, the array source 318 is regularly coupled to a metal or other highly conductive line to provide a low-resistance path to ground. The array ground 320 serves as this low-resistance path.

For one embodiment, each of the memory cells of memory array 200 or 300 corresponds to a single bit. For this embodiment, two possible Vt levels are controlled by the amount of charge that is programmed or stored on the floating gate. If a cell Vt is above a read voltage applied to its control gate, it has a first data value; if below, a second data value.

For another embodiment, each of the memory cells of memory array 200 or 300 is a multilevel cell for storing multiple bits when its floating gate is charged to different levels. For example, each memory cell may be assigned four different voltage ranges of 200 mV for each range. For another embodiment, a dead space or guard band of 0.2V to 0.4V is between each range. If the charge stored on the cell causes a Vt within the first range, the cell is storing a 00. If the charge stored on the cell causes a Vt within the second range, the cell is storing a 01. This continues for as many ranges are used for the cell.

To program memory array 110 of memory device 100, address register 106 receives an address request from processor 150 that indicates a group of memory cells 208 or 308, e.g., such as a group of 32 cells, to be programmed. Control circuitry 104 then selects that group of cells for programming. Control circuitry 104 also decodes a program command received from processor 150. This latches data to be programmed.

Programming commences by pumping a voltage on the control gate of each cell of the addressed group of memory cells, e.g., from an operating voltage (Vcc) or ground (Vss), to the programming voltage Vpp using charge pumps of charge pump circuitry 102 and by applying a voltage, e.g., about half of Vpp, to the drain of each memory cell. This places a charge on the floating gate. As the floating gate is charged, the charge pump circuitry 102 needs to supply at least enough current to charge all of the addressed memory cells. For example, if each cell of a group of 32 cells requires 200 µA for programming, charge pump circuitry 102 needs to supply at least about 6 mA. In some instances, only subset of all the cells of the addressed group of cells needs to be programmed, e.g., only 16 of a group of 32 cells may require programming, thus requiring a lower supply current from the charge pumps, e.g., about 3 mA. However, the charge pumps are still sized to supply at least the current required for programming all of the cells of the addressed group of cells, e.g., 32 cells.

Subsequently a program-verify is performed to determine whether each of the addressed cells is programmed. The program-verify involves applying a program verify voltage, e.g., a voltage at or slightly above a threshold voltage (Vt) of an erased single-bit cell, to the control gate of each of the cells and removing the voltage from the drain of each of the cells. Then, the current of each cell is sensed, e.g., using sense amplifier and compare circuitry 120 of memory device 100. If a cell current is above a reference value, indicating that the Vt of the cell is below that of a programmed cell, that cell is inadequately programmed. If a cell current is below the reference value, indicating that the Vt of the cell is above that of an erased cell, that cell is adequately programmed.

The number of inadequately programmed cells is normally a fraction of the all the cells of the addressed group of cells or the subset of all the cells of the addressed group of cells, e.g., 4 cells of a subset of 16 cells of an addressed group of 32 cells, and thus less current is required for programming these cells. For example, if each cell requires 200 µA for programming, the charge pumps would need to supply at least about 800 µA. However, the charge pumps are still sized to supply at least the current required for programming all of the cells of the addressed group of cells, e.g., 32 cells. Therefore, while the charge pumps need to be sized to program every addressed cell, it is usually only a fraction of the cells that needs to be programmed initially, and an even smaller fraction after the program verify.

Figure 4:
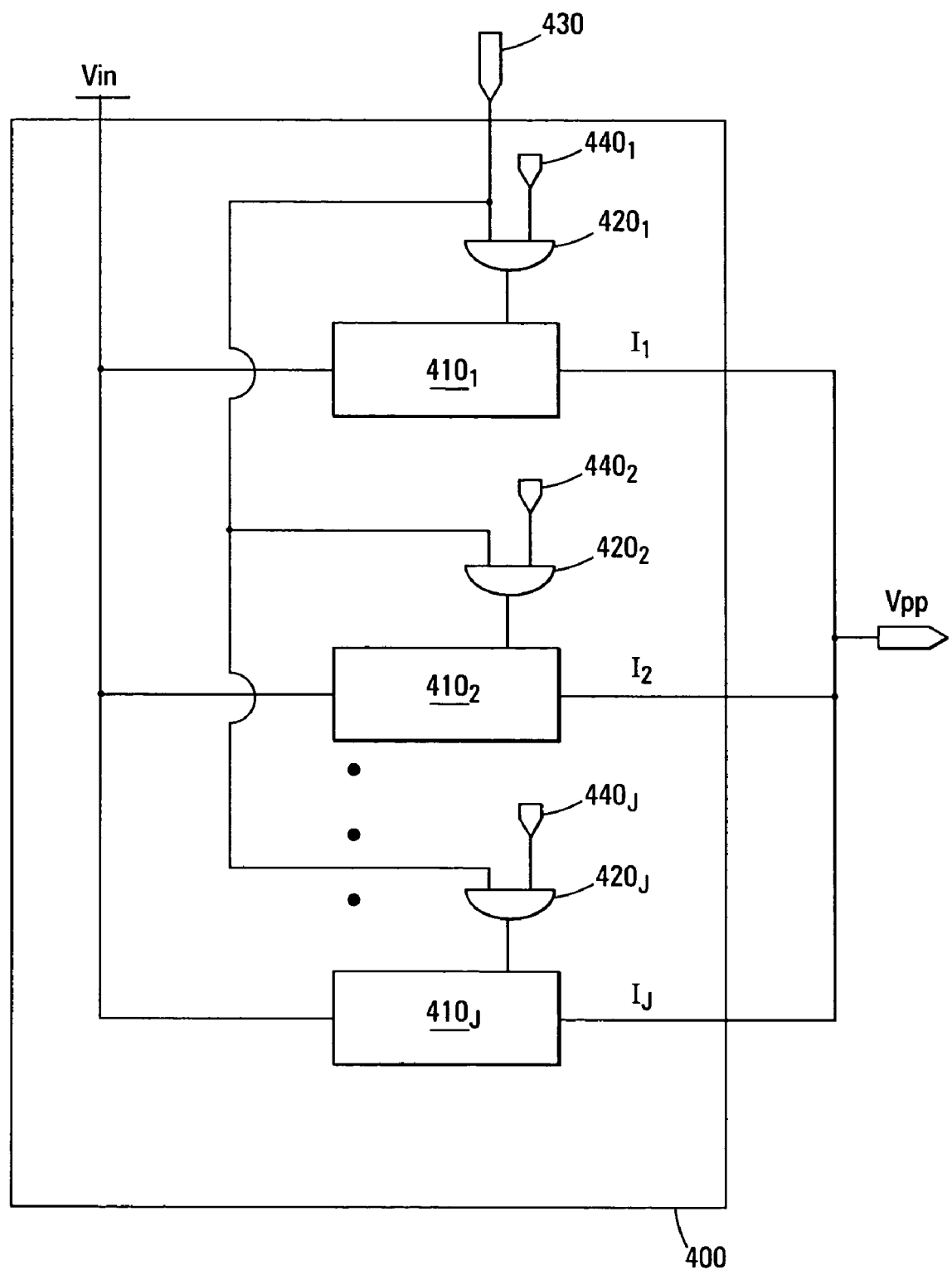
FIG. 4 is a block diagram illustrating a portion of charge pump circuitry, according to another embodiment of the present invention.

FIG. 4 is a block diagram illustrating a portion of charge pump circuitry 400, such as a portion of charge pump circuitry 102 of memory device 100 of FIG. 1, according to another embodiment of the present invention. Charge pump circuitry 400 includes charge pumps $410_1$ to $410_J$ connected in parallel. For one embodiment, AND gates $420_1$ to $420_J$ are respectively connected to charge pumps $410_1$ to $410_J$. Each of charge pumps 410 receives an input voltage Vin, such as Vcc from a power supply of the memory device 100 or Vss.

For one embodiment, a first input of each of AND gates 420 is adapted to receive a global control signal 430, such as an enable signal, while a second input of each of the AND gates 420 is adapted to receive a distinct local control signal 440, i.e., AND gates $420_1$ to $420_J$ are adapted to respectively receive control signals $440_1$ to $440_J$ at their second inputs. For another embodiment, when the global signal 430 set at a logic high and each of the control signals 440 is set a logic high, each of the charge pumps 410 is enabled and pumps the input voltage Vin to an output voltage, such as the programming voltage Vpp, for application to the control gates of 208 of FIG. 2 or 308 of FIG. 3.

When enabled, each of the charge pumps 420 outputs a current I that is a fraction of the total current required for programming all of a group of addressed memory cells of the memory array 110, for example 32 memory cells. When all of the charge pumps 420 are enabled, the sum of their respective currents is generally equal to or greater than the total current required for programming all of the addressed memory cells. For example, if each cell of a group of 32 cells requires 200-µA for programming, the sum of the respective currents of the charge pumps 420 should be about 6 mA. For some embodiments, each of the charge pumps outputs the same fraction of the total current, whereas for other embodiments, each charge pump 420 outputs a different fraction of the total current. For one embodiment, each of a first portion of charge pumps 420 outputs a first fraction of the total current, and each of a second portion of charge pumps 420 outputs a second fraction of the total current.

One or more of the charge pumps 420 can be selectively disabled by setting its respective control signal 440 to a logic low while the global control signal 430 is at a logic high. Conversely, one or more of the charge pumps 420 can be selectively enabled by setting its respective control signal 440 to a logic high while the global control signal 430 is at a logic high. Selectively enabling or disabling one or more of the charge pumps 420 allows different amounts of current to be delivered to the memory array. All of charge pumps 420 can be disabled by setting their respective control signals 400 to logic lows or by setting the global control signal 430 to a logic low.

It is noted that other logic can be implemented to selectively enable one or more of the charge pumps. For example, each charge pump could be selectively enabled without the use of a global control signal.

For one embodiment, to program all of the memory cells of a group of addressed memory cells of memory array 110, control circuitry 104 enables all of the charge pumps 410 by setting the global control signal 430 and each of the local control signals 440 to logic highs, e.g., in response to the program command from processor 150. This causes at least the amount of current required for programming all of the addressed memory cells to be supplied thereto.

If only a portion all of the memory cells of the group needs to be programmed, control circuitry 104 determines the number of charge pumps required to supply at least the amount of current required for programming the portion of memory cells. For example, if the portion of memory cells is below a first value and greater than or equal to a second value, control circuitry 104 determines that a first number of pumps are required and subsequently activates the first number of pumps. That is, 16 memory cells may require programming, and control circuitry 104 may be programmed to select 4 charge pumps for programming less than 20 cells and greater than or equal to 15 cells. Therefore, for this example, control circuitry 104 determines that 4 charge pumps need to be activated. Moreover, control circuitry 104 may be programmed to select 5 charge pumps for programming greater than or equal to 20 cells and less than 25 cells or 3 charge pumps for less than 15 cells and greater than or equal to 10 cells.

For one embodiment, control circuitry 104 includes a look-up table for matching the number of cells being programmed to the number of pumps required to supply at least the amount of current needed to program that number of cells. That is, the look-up table includes a plurality of numbers of memory cells tabulated against a plurality of numbers of charge pumps to be activated, where each of the numbers of memory cells corresponds to a respective one of the numbers of charge pumps to be activated for that number of memory cells.

A program-verify is then performed to determine if any of the memory cells needing programming have not been adequately programmed. This information is conveyed to control circuitry 104. If any addressed memory cells have not been adequately programmed, control circuitry 104 determines the number of pumps required for supplying at least the amount of current for programming the inadequately programmed memory cells.

Typically, the number of inadequately programmed memory cells is a fraction of the previous number of memory cells needing programming and thus a fraction of the current is required to program these inadequately programmed memory cells. For one embodiment, control circuitry 104 disables an appropriate number of the charge pumps 410, e.g., by setting the local control signals 440 for these charge pumps to logic low. If any of these memory cells remain inadequately programmed, the process is repeated, i.e., the current required for programming the inadequately programmed memory cells is determined, and more charge pumps are disabled for more closely matching the required current. By matching current output to demand, pump overshoot is reduced, thus leading to reduced oscillation of the output.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of programming a memory array, comprising:
    performing a program-verify operation to determine a number of memory cells to be programmed; and
    selectively enabling one or more of a plurality of charge pumps based on the number of memory cells to be programmed.

2. The method of claim 1, wherein selectively enabling one or more of a plurality of charge pumps provides at least enough current for programming the number of memory cells to be programmed.

3. The method of claim 1, wherein the number of memory cells to be programmed is a subset of a number addressed memory cells.

4. The method of claim 1, wherein enabling one or more of a plurality of charge pumps causes a programming voltage to be supplied to each of the memory cells.

5. The method of claim 1, wherein selectively enabling one or more of a plurality of charge pumps is in response to receiving an enable signal at each of the one or more charge pumps.

6. A method of programming a memory array, comprising:
    selectively enabling one or more of a plurality of charge pumps based on a number of memory cells to be programmed;
    wherein selectively enabling one or more of a plurality of charge pumps comprises receiving a global enable signal at each of the plurality of charge pumps and a local enable signal at each of the one or more charge pumps of the plurality of charge pumps.

7. A method of programming a memory array, comprising:
    selectively enabling one or more of a plurality of charge pumps based on a number of memory cells to be programmed.
    wherein each of a first portion of the charge pumps outputs a first fraction of a total current output of the plurality of charge pumps, and each of a second portion of charge pumps outputs a second fraction, different than the first fraction, of the total current output of the plurality of charge pumps.

8. A method of programming a memory array, comprising:
- performing a program-verify operation to determine a number of memory cells to be programmed;
- determining a number of a plurality of charge pumps to be enabled based on the number of memory cells to be programmed; and
- selectively enabling the number of charge pumps.

9. The method of claim 8, wherein determining the number of charge pumps comprises comparing the number of memory cells to be programmed to preselected numbers of memory cells that respectively correspond to preselected numbers of charge pumps to be activated.

10. The method of claim 8, wherein a first number of the plurality of charge pumps is determined to be enabled when the number of the memory cells to be programmed is less than a first number of memory cells and greater than or equal to a second number of memory cells, and wherein a second number of the plurality of charge pumps is determined to be enabled when the number of the memory cells to be programmed is less than the second number of memory cells.

11. The method of claim 8, wherein the number of memory cells to be programmed is a subset of a number addressed memory cells.

12. The method of claim 8, wherein selectively enabling one or more of a plurality of charge pumps is in response to receiving an enable signal at each of the one or more charge pumps.

13. A method of programming a memory array, comprising:
- determining a number of a plurality of charge pumps to be enabled based on a number of memory cells to be programmed; and
- selectively enabling the number of charge pumps;
- wherein selectively enabling the number of charge pumps comprises receiving a global enable signal at each of the charge pumps and a local enable signal at each of the charge pumps.

14. A method of programming a memory array, comprising:
- determining a number of memory cells to be programmed;
- selecting a first number of charge pumps, based on the number of memory cells to be programmed, for supplying a programming voltage to the memory cells;
- programming the memory cells;
- determining if any of the memory cells are inadequately programmed;
- selecting a second number of charge pumps, based on a number of cells determined to be inadequately programmed, for supplying the programming voltage to those cells determined to be inadequately programmed; and
- reprogramming the memory cells determined to be inadequately programmed.

15. The method of claim 14, wherein the first number of charge pumps is selected when the number of the memory cells to be programmed is less than a first number of memory cells and greater than or equal to a second number of memory cells, and wherein the second number of charge pumps is selected when the number of the inadequately programmed memory cells is less than the second number of memory cells.

16. The method of claim 14, wherein the number of memory cells to be programmed is a subset of a number addressed memory cells.

17. The method of claim 14, wherein selecting the first or second number of charge pumps is in response to receiving an enable signal at each of the first or second number of charge pumps.

18. A method of operating a memory device, comprising:
- supplying a first current to memory cells of a memory array of the memory device for programming the memory cells;
- determining whether any of the memory cells are inadequately programmed;
- if there are any inadequately programmed memory cells, determining a second current sufficient for programming the inadequately programmed memory cells, based on a number of inadequately programmed memory cells, wherein the second current is a fraction of the first current; and
- supplying at least the second current to the inadequately programmed memory cells for programming the inadequately programmed memory cells.

19. The method of claim 18, wherein supplying the first current to memory cells of a memory array further comprises enabling a plurality of parallel charge pumps of the memory device, each of the charge pumps outputting a fraction of the first current.

20. The method of claim 18, wherein supplying the second current to the inadequately programmed memory cells further comprises disabling one or more of a plurality of parallel charge pumps of the memory device, each of the charge pumps outputting a fraction of the first current, so that the remaining charge pumps supply at least the second current.

21. The method of claim 18, wherein determining whether any of the memory cells are inadequately programmed further comprises comparing a current of each of the memory cells to a reference current when a program verify voltage is applied its control gate.

22. The method of claim 18, wherein supplying a first current to memory cells of a memory array comprises applying a programming voltage to a control gate of each memory cell of a subset of a group of addressed memory cells.

23. The method of claim 22, wherein supplying the second current to the inadequately programmed memory cells comprises applying the programming voltage to the control gate of each of the inadequately programmed memory cells.

24. The method of claim 18, wherein each of the memory cells is a floating-gate transistor.

25. The method of claim 18, wherein each of the memory cells is a multilevel cell.

26. A method of operating a memory device, comprising:
- performing a program-verify operation to determine a fraction of a number of addressed memory cells of a memory array of the memory device to be programmed;
- determining an amount of current sufficient for programming the fraction of the number of addressed memory cells to be programmed; and
- enabling a fraction of a total number of parallel charge pumps of the memory device, based on the determined current, for supplying at least the current sufficient for programming the fraction of the number of addressed memory cells, wherein each of the charge pumps supplies a fraction of the current.

27. A method of operating a memory device, comprising:
- enabling a plurality of parallel charge pumps of the memory device to supply a first current to memory cells of a memory array of the memory device selected for programming, each of the charge pumps outputting a fraction of the first current;

determining whether any of the memory cells selected for programming are inadequately programmed;

if there are any inadequately programmed memory cells, determining a second current sufficient for programming the inadequately programmed memory cells, based on a number of inadequately programmed memory cells, wherein the second current is a fraction of the first current; and disabling one or more of the plurality of parallel charge pumps of the memory device so that the remaining charge pumps supply at least the second current to the inadequately programmed memory cells for programming the inadequately programmed memory cells.

28. The method of claim 27, wherein determining whether any of the memory cells selected for programming are inadequately programmed is accomplished by performing a program-verify operation.

29. The method of claim 28, wherein the program-verify operation comprises:

applying a program-verify voltage to a control gate of each of the memory cells selected for programming; and comparing a resulting current of each of the memory cells selected for programming to a reference current.

30. The method of claim 27, wherein the plurality of parallel charge pumps applies a programming voltage to a control gate of each of the memory cells selected for programming.

31. The method of claim 30, wherein the remaining charge pumps apply the programming voltage to the control gate of each of the inadequately programmed memory cells.

32. A method of operating a memory device, comprising:

selecting a group of memory cells of a memory array of the memory device for programming;

enabling a plurality of parallel charge pumps of the memory device to supply a first current to the selected memory cells to program the selected memory cells, each of the charge pumps outputting a fraction of the first current;

determining whether any of the selected memory cells are inadequately programmed;

if there are any inadequately programmed memory cells, determining a second current sufficient for programming the inadequately programmed memory cells, based on a number of inadequately programmed memory cells, wherein the second current is a fraction of the first current; and disabling one or more of the plurality of parallel charge pumps of the memory device so that the remaining charge pumps supply at least the second current to the inadequately programmed memory cells for programming the inadequately programmed memory cells.

33. A flash memory device comprising:

a memory array comprising flash memory cells arranged in rows and columns;

control circuitry for controlling access to the array; and charge pump circuitry comprising a plurality of parallel charge pumps for supplying a programming voltage to the array;

wherein the control circuitry is adapted to perform a program-verify operation;

wherein each of the charge pumps is adapted to output a fraction of a total current capacity of the charge pump circuitry; and wherein each of the charge pumps is adapted to be selectively enabled by the control circuitry for adjusting current output from the charge pump circuitry to the memory array according to a number of the memory cells to be programmed, as determined from the program-verify operation.

34. The flash memory device of claim 33, wherein the memory array is a NAND or a NOR memory array.

35. The flash memory device of claim 33, wherein each of the memory cells is a floating-gate transistor.

36. The flash memory device of claim 33, wherein each of the memory cells is a multilevel cell.

37. A flash memory device comprising:

a memory array comprising flash memory cells arranged in rows and columns;

control circuitry for controlling access to the array; and charge pump circuitry comprising a plurality of parallel charge pumps for supplying a programming voltage to the array;

wherein each of the charge pumps is adapted to output a fraction of a total current capacity of the charge pump circuitry; and wherein each of the charge pumps is adapted to be selectively enabled by the control circuitry for adjusting current output from the charge pump circuitry to the memory array according to a number of the memory cells to be programmed;

wherein the control circuitry comprises a look-up table comprising a plurality of numbers of memory cells tabulated against a plurality of numbers of charge pumps to be enabled, wherein each of the numbers of memory cells corresponds to a respective one of the numbers of charge pumps to be enabled for that number of memory cells.

38. A flash memory device comprising:

a memory array comprising flash memory cells arranged in rows and columns;

control circuitry for controlling access to the array; and charge pump circuitry comprising a plurality of parallel charge pumps for supplying a programming voltage to the array;

wherein each of the charge pumps is adapted to output a fraction of a total current capacity of the charge pump circuitry;

wherein each of the charge pumps is adapted to be selectively enabled by the control circuitry for adjusting current output from the charge pump circuitry to the memory array according to a number of the memory cells to be programmed; and wherein each of the charge pumps is further adapted to output a different of the total current capacity of the charge pump circuitry.

39. A flash memory device comprising:

an array of flash memory cells;

an address register for receiving address requests for addressing the array; and control circuitry for controlling access to the array, wherein the control circuitry is adapted to perform a method of programming the array when the control circuitry receives a program command, the method comprising;

selectively enabling one or more of a plurality of charge pumps based on a number of memory cells to be programmed; and performing a program-verify operation to determine the number of memory cells to be programmed.

40. The flash memory device of claim 39, wherein, in the method, the number of memory cells to be programmed is a subset of a number addressed memory cells.

41. The flash memory device of claim 39, wherein, in the method, enabling one or more of a plurality of charge pumps causes a programming voltage to be supplied to each of the memory cells.

42. The flash memory device of claim 39, wherein, in the method, selectively enabling one or more of a plurality of charge pumps is in response to receiving an enable signal at each of the one or more charge pumps.

43. A flash memory device comprising:
an array of flash memory cells;
an address register for receiving address requests for addressing the array; and
control circuitry for controlling access to the array, wherein the control circuitry is adapted to perform a method of programming the array when the control circuitry receives a program command, the method comprising:
selectively enabling one or more of a plurality of charge pumps based on a number of memory cells to be programmed;
wherein selectively enabling one or more of a plurality of charge pumps comprises receiving a global enable signal at each of the plurality of charge pumps and a local enable signal at each of the one or more charge pumps of the plurality of charge pumps.

44. A flash memory device comprising:
an array of flash memory cells;
an address register for receiving address requests for addressing the array; and
control circuitry for controlling access to the array, wherein the control circuitry is adapted to perform a method of programming the array when the control circuitry receives a program command, the method comprising:
performing a program-verify operation to determine a number of memory cells to be programmed;
determining a number of a plurality of charge pumps to be enabled based on the number of memory cells to be programmed; and
selectively enabling the number of charge pumps.

45. The flash memory device of claim 44, wherein, in the method, determining the number of charge pumps comprises comparing the number of memory cells to be programmed to preselected numbers of memory cells that respectively correspond to preselected numbers of charge pumps to be activated.

46. The flash memory device of claim 44, wherein, in the method, a first number of the plurality of charge pumps is determined to be enabled when the number of the memory cells to be programmed is less than a first number of memory cells and greater than or equal to a second number of memory cells, and wherein a second number of the plurality of charge pumps is determined to be enabled when the number of the memory cells to be programmed is less than the second number of memory cells.

47. The flash memory device of claim 44, wherein, in the method, selectively enabling one or more of a plurality of charge pumps is in response to receiving an enable signal at each of the one or more charge pumps from the control circuitry.

48. A flash memory device comprising:
an array of flash memory cells;
an address register for receiving address requests for addressing the array; and
control circuitry for controlling access to the array, wherein the control circuitry is adapted to perform a method of programming the array when the control circuitry receives a program command, the method comprising:
determining a number of a plurality of charge pumps to be enabled based on a number of memory cells to be programmed; and
selectively enabling the number of charge pumps; and
wherein selectively enabling the number of charge pumps comprises receiving a global enable signal at each of the charge pumps from the control circuitry and a local enable signal at each of the charge pumps of the plurality of charge pumps from the control circuitry.

49. A flash memory device comprising:
an array of flash memory cells;
an address register for receiving address requests for addressing the array; and
control circuitry for controlling access to the array, wherein the control circuitry is adapted to perform a method of programming the array when the control circuitry receives a program command, the method comprising:
determining a number of memory cells to be programmed;
selecting a first number of charge pumps, based on the number of memory cells to be programmed, for supplying a programming voltage to the memory cells;
programming the memory cells;
determining if any of the memory cells are inadequately programmed;
selecting a second number of charge pumps, based on a number of cells determined to be inadequately programmed, for supplying the programming voltage to those cells determined to be inadequately programmed; and
reprogramming the memory cells determined to be inadequately programmed.

50. The flash memory device of claim 49, wherein, in the method, the first number of charge pumps is selected when the number of the memory cells to be programmed is less than a first number of memory cells and greater than or equal to a second number of memory cells, and wherein the second number of charge pumps is selected when the number of the inadequately programmed memory cells is less than second number of memory cells.

51. The flash memory device of claim 49, wherein, in the method, selectively enabling one or more of a plurality of charge pumps is in response to receiving an enable signal at each of the one or more charge pumps from the control circuitry.

52. The flash memory device of claim 49, wherein, in the method, selectively enabling one or more of a plurality of charge pumps comprises receiving a global enable signal at each of the plurality of charge pumps from the control circuitry and a local enable signal at each of the one or more charge pumps of the plurality of charge pumps from the control circuitry.

53. A flash memory device comprising:
an array of flash memory cells;
an address register for receiving address requests for addressing the array; and
control circuitry for controlling access to the array, wherein the control circuitry is adapted to perform a method of programming the array when the control circuitry receives a program command, the method comprising:
- in response to the program command and an address request for selecting a group of memory cells of the array for programming, supplying a first current to the group of memory cells to program the group of memory cells;
- determining whether any of the group of memory cells are inadequately programmed;
- if there are any inadequately programmed memory cells, determining a second current sufficient for programming the inadequately programmed memory cells, based on a number of inadequately programmed memory cells, wherein the second current is a fraction of the first current; and
- supplying at least the second current to the inadequately programmed memory cells for programming the inadequately programmed memory cells.

54. The flash memory device of claim 53, wherein, in the method, determining whether any of the group of memory cells are inadequately programmed further comprises comparing a current of each of the group of memory cells to a reference current when a program verify voltage is applied its control gate.

55. The flash memory device of claim 53, wherein, in the method, supplying a first current to the group of comprises applying a programming voltage to a control gate of each of the group of memory cells.

56. The flash memory device of claim 55, wherein, in the method, supplying the second current to the inadequately programmed memory cells comprises applying the programming voltage to the control gate of each of the inadequately programmed memory cells.

57. A flash memory device comprising;
- an array of flash memory cells;
- charge pump circuitry comprising a plurality of parallel charge pumps for supplying a programming voltage to the array;
- an address register for receiving address requests for addressing the array; and
- control circuitry for controlling access to the array, wherein the control circuitry is adapted to perform a method of programming the array when the control circuitry receives a program command, the method comprising:
  - in response to the program command and an address request for selecting a group of memory cells of the array for programming, enabling the plurality of parallel charge pumps to supply a first current to the group of the memory cells to program the group of memory cells, each of the charge pumps outputting a fraction of the first current;
  - determining whether any of the group of memory cells are inadequately programmed;
  - if there are any inadequately programmed memory cells, determining a second current sufficient for programming the inadequately programmed memory cells, based on a number of inadequately programmed memory cells, wherein the second current is a fraction of the first current; and
  - disabling one or more the plurality of parallel charge pumps of the memory device so that the remaining charge pumps supply at least the second current to the inadequately programmed memory cells for programming the inadequately programmed memory cells.

58. The flash memory device of claim 57, wherein, in the method, determining whether any of the group of memory cells are inadequately programmed is accomplished by performing a program-verify operation.

59. The flash memory device of claim 58, wherein, in the method, the program-verify operation comprises:
- applying a program-verify voltage to a control gate of each of the group of memory cells; and
- comparing a current of each of the group of memory cells to a reference current.

60. The flash memory device of claim 57, wherein, in the method, the plurality of parallel charge pumps supplies the programming voltage to a control gate of each of the group of memory cells.

61. The flash memory device of claim 60, wherein, in the method, the remaining charge pumps supply the programming voltage to a control gate of each of the inadequately programmed memory cells.

62. An electronic system comprising:
- a processor;
- a control link connected to the processor;
- a data link connected to the processor;
- an address link connected to the processor; and
- a flash memory device comprising:
  - an array of flash memory cells;
  - an address register connected to the address link for receiving address requests for addressing the array; and
  - control circuitry connected to the control link for controlling access to the array, wherein the control circuitry is adapted to perform a method of programming the array when the control circuitry receives a program command, the method comprising:
    - selectively enabling one or more of a plurality of charge pumps based on a number of memory cells to be programmed; and
    - performing a program-verify operation to determine the number of memory cells to be programmed.

63. An electronic system comprising:
- a processor;
- a control link connected to the processor;
- a data link connected to the processor;
- an address link connected to the processor; and
- a flash memory device comprising;
  - an array of flash memory cells;
  - an address register connected to the address link for receiving address requests for addressing the array; and
  - control circuitry connected to the control link for controlling access to the array, wherein the control circuitry is adapted to perform a method of programming the array when the control circuitry receives a program command, the method comprising:
    - determining a number of a plurality of charge pumps to be enabled based on a number of memory cells to be programmed; and
    - selectively enabling the number of charge pumps;
    - wherein selectively enabling the number of charge pumps comprises receiving a global enable signal at each of the charge pumps and a local enable signal at each of the charge pumps.

64. An electronic system comprising:
- a processor;
- a control link connected to the processor;
- a data link connected to the processor;
- an address link connected to the processor; and
- a flash memory device comprising:

an array of flash memory cells;

an address register connected to the address link for receiving address requests for addressing the array; and control circuitry connected to the control link for controlling access to the array, wherein the control circuitry is adapted to perform a method of programming the array when the control circuitry receives a program command, the method comprising:

determining a number of memory cells to be programmed;

selecting a first number of charge pumps, based on the number of memory cells to be programmed, for supplying a programming voltage to the memory cells;

programming the memory cells;

determining if any of the memory cells are inadequately programmed;

selecting a second number of charge pumps, based on a number of cells determined to be inadequately programmed, for supplying the programming voltage to those cells determined to be inadequately programmed; and reprogramming the memory cells determined to be inadequately programmed.

65. An electronic system comprising:

a processor;

a control link connected to the processor;

a data link connected to the processor;

an address link connected to the processor; and a flash memory device comprising:

an array of flash memory cells;

a data input/output buffer circuit connected to the data link;

charge pump circuitry comprising a plurality of parallel charge pumps for supplying a programming voltage to the array;

an address register connected to the address link, wherein the address register receives address requests from the processor for addressing the array; and control circuitry for controlling access to the array, the control circuitry connected to the control link, wherein the control circuitry is adapted to perform a method of programming the array flash memory cells when the control circuitry receives a program command from the processor, the method comprising:

in response to the program command and an address request for selecting a group of memory cells of the array for programming, enabling the plurality of parallel charge pumps to supply a first current to the group of the memory cells to program the group of memory cells, each of the charge pumps outputting a fraction of the first current;

determining whether any of the group of memory cells are inadequately programmed;

if there are any inadequately programmed memory cells, determining a second current sufficient for programming the inadequately programmed memory cells, based on a number of inadequately programmed memory cells, wherein the second current is a fraction of the first current; and disabling one or more the plurality of parallel charge pumps of the memory device so that the remaining charge pumps supply at least the second current to the inadequately programmed memory cells for programming the inadequately programmed memory cells.

66. An electronic system comprising:

a processor; and a flash memory device coupled to the processor, the flash memory device comprising:

a memory array comprising flash memory cells arranged in rows and columns;

control circuitry for controlling access to the array; and charge pump circuitry comprising a plurality of parallel charge pumps for supplying a programming voltage to the array;

wherein each of the charge pumps is adapted to output a fraction of a total current capacity of the charge pump circuitry;

wherein each of the charge pumps is adapted to be selectively enabled by the control circuitry for adjusting a current output of the charge pump circuitry according to a number of the memory cells to be programmed; and wherein each of the charge pumps is further adapted to output a different fraction of the total current capacity of the charge pump circuitry.

\* \* \* \* \*

UNITED STATES PATENT AND TRADEMARK OFFICE
CERTIFICATE OF CORRECTION

PATENT NO. : 7,154,785 B2 Page 1 of 1
APPLICATION NO. : 10/877394
DATED : December 26, 2006
INVENTOR(S) : Frankie F. Roohparvar It is certified that error appears in the above-identified patent and that said Letters Patent is hereby corrected as shown below:

Column 12, line 51, replace "a different of the total" with --a different fraction of the total--.

Signed and Sealed this

Fourth Day of December, 2007

JON W. DUDAS
*Director of the United States Patent and Trademark Office*